United States Patent
Padalia et al.

(10) Patent No.: US 7,415,682 B2
(45) Date of Patent: Aug. 19, 2008

(54) AUTOMATIC ADJUSTMENT OF OPTIMIZATION EFFORT IN CONFIGURING PROGRAMMABLE DEVICES

(75) Inventors: Ketan Padalia, Thornhill (CA); Jason Peters, Toronto (CA); Vaughn Betz, Toronto (CA)

(73) Assignee: Altera Corporation, San Jose, CA (US)

( * ) Notice: Subject to any disclaimer, the term of this patent is extended or adjusted under 35 U.S.C. 154(b) by 311 days.

(21) Appl. No.: 11/097,592

(22) Filed: Apr. 1, 2005

(65) Prior Publication Data

US 2006/0225021 A1    Oct. 5, 2006

(51) Int. Cl.
*G06F 17/50* (2006.01)
*H03K 17/693* (2006.01)

(52) U.S. Cl. ........................... 716/2; 716/16
(58) Field of Classification Search ................ 716/2, 716/8–10, 16–17
See application file for complete search history.

(56) References Cited

U.S. PATENT DOCUMENTS

| | | | | |
|---|---|---|---|---|
| 6,957,400 B2* | 10/2005 | Liu et al. | | 716/1 |
| 7,111,262 B1* | 9/2006 | Singh | | 716/7 |
| 7,191,426 B1* | 3/2007 | Singh et al. | | 716/16 |
| 7,194,720 B1* | 3/2007 | Borer et al. | | 716/16 |
| 7,194,722 B1* | 3/2007 | Abid et al. | | 716/16 |
| 2002/0069396 A1* | 6/2002 | Bhattacharya et al. | | 716/7 |
| 2005/0204325 A1* | 9/2005 | Fung et al. | | 716/16 |

OTHER PUBLICATIONS http://www.altera.com/corporate/new_room/releases/releases_archive/2004/products/nr-qts2_version4.html.

* cited by examiner

*Primary Examiner*—Paul Dinh
*Assistant Examiner*—Suresh Memula
(74) *Attorney, Agent, or Firm*—Townsend and Townsend and Crew, LLP

(57) ABSTRACT

User designs are assigned to a category for each design goal associated with the user design. Each category represents the difficulty of satisfying a design goal. Optimization phases are tailored to different combinations of categories and are selected according to the categories assigned to the user design. A ranking of the relative difficulty of the design goals is determined from the categories associated with the user design. Parameters of an optimization phase can be modified in accordance with this ranking to focus optimization efforts on specific design goals. The parameters may be weights of a cost function used by the optimization phase to evaluate alternative configurations of the user design. The user design can be re-classified into an additional category if the results of the optimization phase do not satisfy design goals, and additional optimization phases are selected based on this re-classification to further optimize the user design.

28 Claims, 5 Drawing Sheets

AUTOMATIC ADJUSTMENT OF OPTIMIZATION EFFORT IN CONFIGURING PROGRAMMABLE DEVICES

BACKGROUND OF THE INVENTION

The present invention relates to the field of programmable devices, and the systems and methods for programming the same. Programmable devices, such as FPGAs, typically includes thousands of programmable logic cells that use combinations of logic gates and/or look-up tables to perform a logic operation. Programmable devices also include a number of functional blocks having specialized logic devices adapted to a specific logic operations. The logic cells and functional blocks are interconnected with a configurable switching circuit. The configurable switching circuit selectively routes connections between the logic cells and functional blocks. By configuring the combination of logic cells, functional blocks, and the switching circuit, a programmable device can be adapted to perform virtually any type of information processing function.

A typical design cycle for determining the configuration of a programmable device, referred to compilation, starts with an extraction phase, followed by a logic synthesis phase, a fitting phase, and an assembly phase. The extraction phase takes a user design, typically expressed as a netlist in a hardware description language such as Verilog or VHDL, and produces a set of logic gates implementing the user design. In the logic synthesis phase, the set of logic gates is permutated over the hardware architecture of the programmable device in order to match elements of the user design with corresponding portions of the programmable device. The fitting phase assigns the various portions of the user design to specific logic cells and functional blocks and determines the configuration of the configurable switching circuit used to route signals between these logic cells and functional blocks, taking care to satisfy the user timing constraints as much as possible. In the assembly phase, a configuration file defining the programmable device configuration is created. The configuration can then be loaded into a programmable device to implement the user design.

To satisfy the design goals of a user design, one or more additional optimization phases can be used to optimize the user design. Optimization phases can optimize a user design with respect to a number of different design goals, including as overall execution speed, programmable device resource consumption, and power consumption. To yield greater performance of the user design as implemented by the programmable device, it is often desirable to process the user design with two or more optimization phases.

Previously, a number of different optimization techniques were applied to the user design. This approach strives to ensure that complex user designs satisfy as many design goals as possible. However, applying numerous optimization techniques takes a large amount of time to complete. This increases the time need to compile user designs, even relatively simple user designs with more modest design goals.

Additionally, optimization techniques typically optimize user designs to meet two or more design goals. Typically, this requires some tradeoffs between design goals. Previously, these optimization techniques used a predetermined tuning to provide good results for multiple design goals for typical user designs. However, this tuning may waste optimization efforts by focusing large amounts of optimization efforts unnecessarily on design goals that are relatively easy to achieve while neglecting design goals that are much more difficult. As a result, additional time and optimization steps are needed to meet all of the design goals.

Another previous approach tailors optimization phases to user designs by classifying user designs using quantitative metrics associated with one or more design goals, such as timing, fitting, and power consumption. User designs are classified into "easy," "hard," or other categories based on the results of the quantitative metric. User designs can be assigned to different categories for each of its design goals. The system includes optimization phases tuned to each of the different categories or combinations of categories that can be potentially assigned to user designs. Based on the categories assigned to a given user design, the system selects one or more of the set of optimization phases and applies the selected optimization phases to the given user design. The Quartus II Version 4.0 design software produced by the Altera Corporation includes an implementation of this approach.

It is therefore desirable for a system and method to tailor optimization phases to individual user designs. It is also desirable for the system and method to reduce the compilation time of user designs. It is further desirable for the system and method to allocate the optimization efforts for a user design according to the relative difficulty of design goals. It is desirable for the system and method to be adapted to any type of optimization phase applied to the user design at any point in the compilation process.

BRIEF SUMMARY OF THE INVENTION

An embodiment of the invention assigns user designs to one or more categories for each design goal associated with the user design. In an embodiment, each category represents the difficulty of satisfying a corresponding design goal. Optimization phases are tailored to different combinations of categories and an embodiment of the invention selects optimization phases tailored to the combinations of categories matching the set of categories assigned to the user design. A ranking of the relative difficulty of the design goals is determined from the set of categories associated with the user design. Parameters of an optimization phase can then be modified in accordance with this ranking to focus optimization efforts on one or more of the design goals associated with the user design. In an embodiment, the parameters are weights of a cost function used by the optimization phase to evaluate alternative configurations of the user design. In yet another embodiment, the user design can be re-classified into one or more additional categories if the results of the optimization phase do not satisfy one or more design goals associated with the user design, and additional optimization phases are selected based on this re-classification to further optimize the user design.

BRIEF DESCRIPTION OF THE DRAWINGS

The invention will be described with reference to the drawings, in which.

In the drawings, the use of like reference numbers in different drawings indicates similar components.

DETAILED DESCRIPTION OF THE INVENTION

Figure 1:
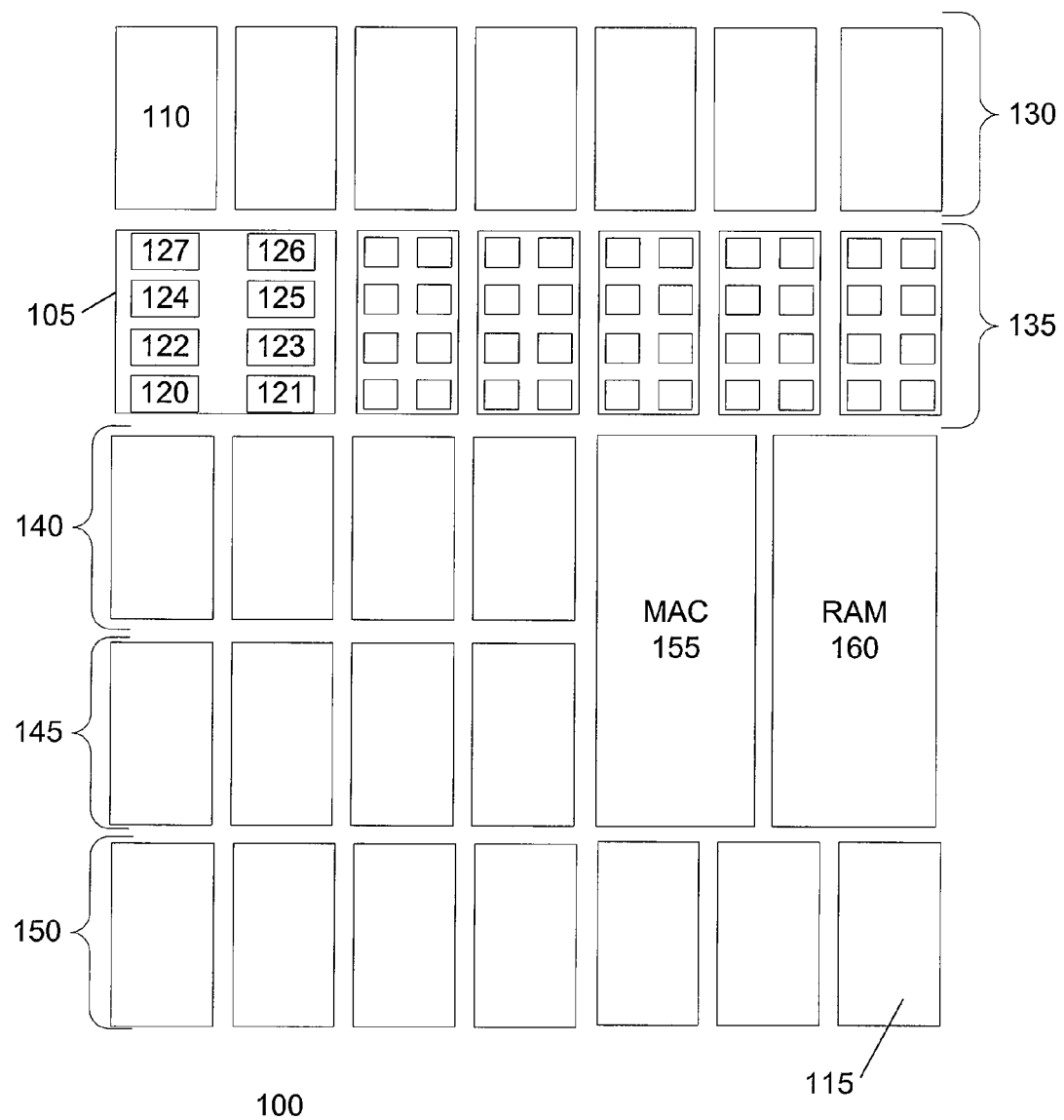
FIG. 1 illustrates a portion of an example programmable device suitable for use with an embodiment of the invention.

FIG. 1 illustrates a portion of an example programmable device 100 suitable for use with an embodiment of the invention. Programmable device 100 includes a number of logic array blocks (LABs), such as LABs 105, 110, 115. Each LAB includes a number of programmable logic cells using logic gates and/or look-up tables to perform a logic operation. LAB 105 illustrates in detail logic cells 120, 121, 122, 123, 124, 125, 126, and 127. Logic cells are omitted from other LABs in FIG. 1 for clarity. The LABs of device 100 are arranged into rows 130, 135, 140, 145, and 150. In an embodiment, the arrangement of logic cells within a LAB and of LABs within rows provides a hierarchical system of configurable connections, in which connections between logic cells within a LAB, between cells in different LABs in the same row, and between cell in LABs in different rows require progressively more resources and operate less efficiently.

In addition to logic cells arranged in LABs, programmable device 100 also include specialized functional blocks, such as multiply and accumulate block (MAC) 155 and random access memory block (RAM) 160. For clarity, the portion of the programmable device 100 shown in FIG. 1 only includes a small number of logic cells, LABs, and functional blocks. Typical programmable devices will include thousands or tens of thousands of these elements.

Figure 2:
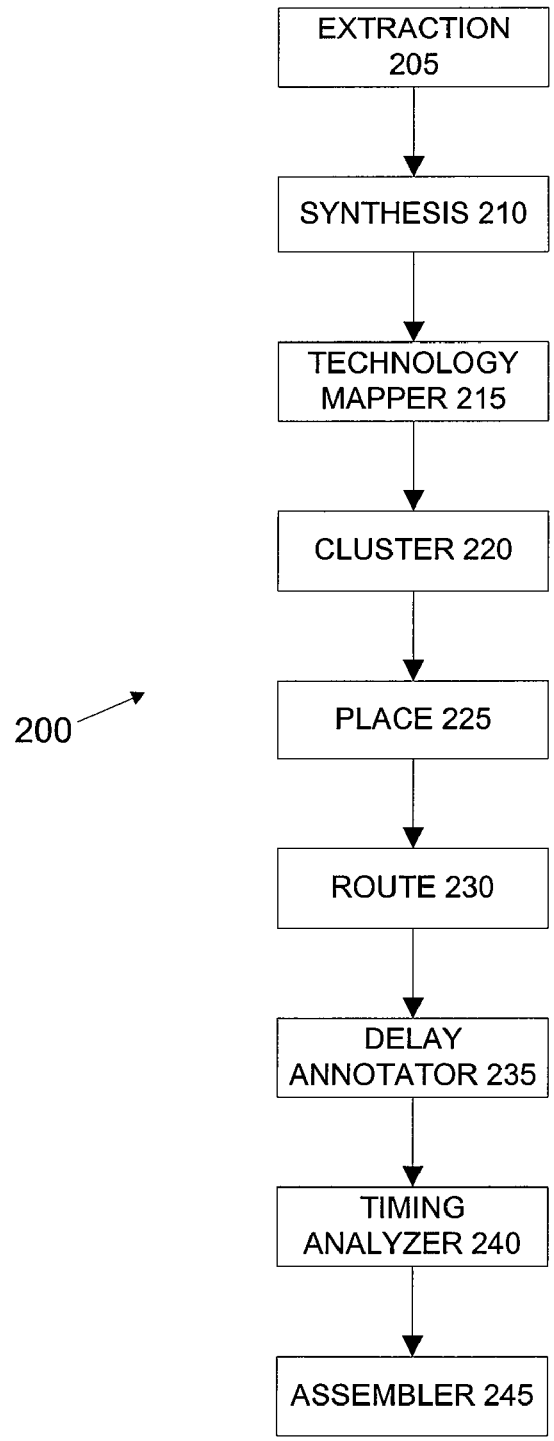
FIG. 2 illustrates the phases of a typical compilation process suitable for implementing an embodiment of the invention.

FIG. 2 illustrates the phases of a typical compilation process 200 suitable for implementing an embodiment of the invention. The compilation process 200 converts a user design into a programmable device configuration adapted to configure a programmable device to implement the user design. The extraction phase 205 converts a description of the user design, expressed for example in a hardware description language, into a register transfer layer description.

Synthesis phase 210 converts the register transfer layer description of the user design into a set of logic gates. Technology mapping phase 215 subdivides the set of logic gates into a set of atoms, which are groups of logic gates matching the capabilities of the logic cells or other functional blocks of the programmable device. A given user design may be converted into any number of different sets of atoms, depending upon the underlying hardware of the programmable device used to implement the user design.

Following the technology mapping phase 215, the cluster phase 220 groups related atoms together into clusters. The place phase 225 assigns clusters of atoms to locations on the programmable device. The route phase 230 determines the configuration of the configurable switching circuit of the programmable device used to connect the atoms implementing the user design.

The delay annotator phase 235 determines the signal delays for the set of atoms and their associated connections in the configurable switching circuit using a timing model of the programmable device. The timing analysis phase 240 determines the maximum operating speed of the programmable device when implementing the user design, for example by determining the portions of the user design have the largest signal delay.

The assembler phase 245 generates a set of configuration information specifying the configuration of the programmable device implementing the user design, including the configuration of each of the logic cells used to implement the user design and the configuration of the configurable switching circuit used to connect the logic cells. The assembler phase 245 can write the configuration information to a configuration file, which can then be used to configure one or more programmable devices to implement instances of the user design.

Figure 3:
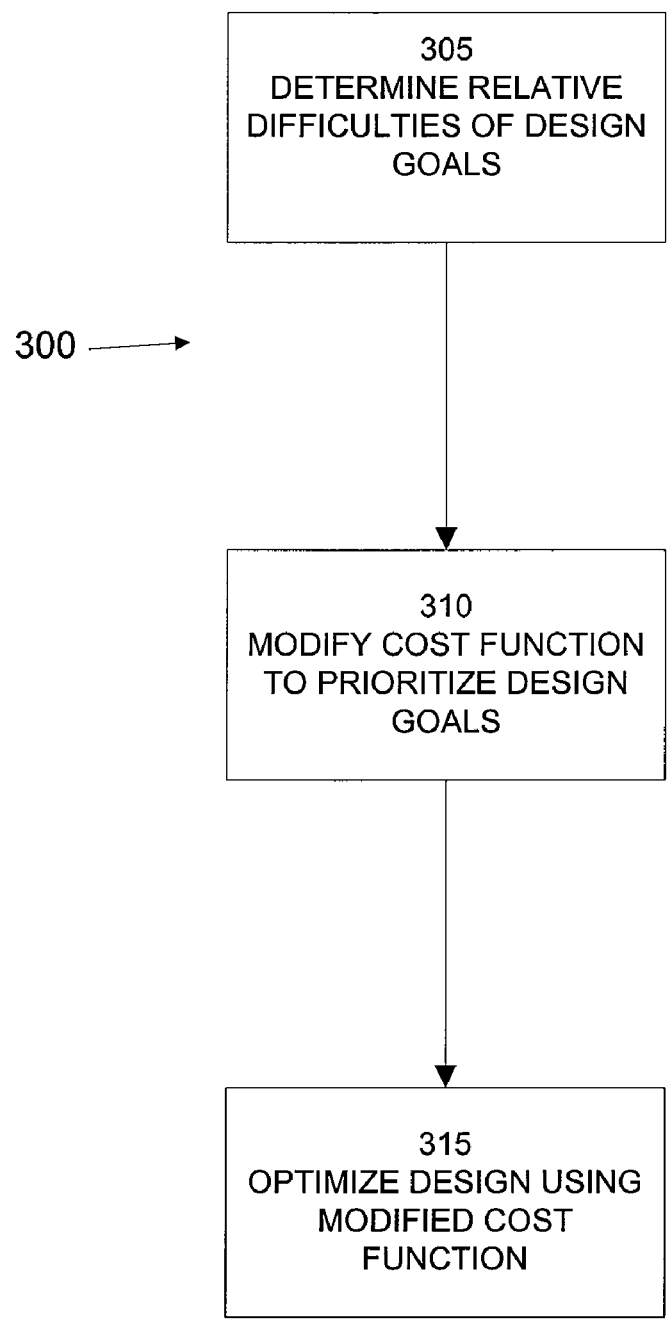
FIG. 3 is a flowchart illustrating a method for tailoring optimization phases to user design according to an embodiment of the invention.

FIG. 3 is a flowchart illustrating a method 300 for tailoring optimization phases to user design according to an embodiment of the invention. Optimization phases determine alternative configurations of a user design that are functionally equivalent and that satisfy design goals, such as timing considerations, fitting considerations, and power considerations. The invention is applicable to any type of optimization phase, regardless of the specific operations performed.

For example, the synthesis phase determines a mapping from the functions or logic gates of the user design to a corresponding set of look-up tables (LUTs) or other components of the programmable device. Although there are many different possible mappings, in general, the optimization phases associated with synthesis try to minimize the number of LUTs connected in series to improve timing, to minimize the total number of LUTs to improve area, and to associate infrequently switching gates together in the same LUTs to improve power consumption.

In another example, the routing phase typically assumes that the configuration of LUTs is fixed for the user design, and attempts to determine an optimal configuration of the configurable switching circuit of the programmable device to implement the user design. Optimization phases associated with routing try to assign timing critical paths the most direct routes to improve timing, to assign frequently switching paths to different parts of the programmable device, and to avoid using assigning too many paths to the same portion of the programmable device to minimize interconnect usage and to prevent congestion.

Step 305 determines the difficulties of satisfying all of the design goals of the user design. In an embodiment, step 305 uses quantitative metrics to classify the user design into one or more categories for each design goal. For example, if timing is a design goal, then a quantitative metric associated with timing is used to classify the user design. Examples of timing metrics include the worst-case values, distributions, and weighted averages timing slack values. Timing slack is the difference between the estimated timing value of a path in the user design and the critical timing value of the path according to the timing design goals of the user design. In an embodiment, the compilation phases estimate the values of quantitative metrics for the user design, such as timing slacks, interconnect usage, routing congestion, device area usage, and power consumption.

In an embodiment, the user design is assigned to an "easy" or "hard" category based on the results of the quantitative metric. Continuing with the above example, the timing metric, such as the timing slack values of a set of the most critical paths in the user design, are compared with a timing threshold value. If the timing metric is less than this threshold, for example because the set of critical paths in the user design all have small timing slack values, then the user design is assigned to a "hard" timing category. (Small timing slack values indicate that paths are very close to exceeding its timing limits.) Conversely, a timing metric above a timing threshold value is assigned to an "easy" timing category. A similar evaluation is performed for the other design goals associated with the user design, such as placement, fitting, and power consumption. For example, the user design can be classified into an "easy" or "hard" fitting category based on a comparison of estimated interconnect usage or estimated signal congestion for the user design with a fitting threshold value. In further embodiments, additional threshold values can be used to classify user designs into any number of categories for each design goal, rather than only "easy" or "hard" categories.

An embodiment of method 300 assigns the user design to "easy," "hard," or other categories based on a comparison of a quantitative metric with a threshold value for each design goal. For each design goal, the associated categories are ranked according to relative difficulty. For example, user designs assigned to the "hard" timing category will be ranked as more difficult to satisfy timing than user designs assigned to the "easy" timing category. In further embodiments with more than two categories associated with a design goal, any arbitrary rank can be assigned to each category.

Step 305 determines the relative difficulty of satisfying each of the design goals associated with the user designs. For an example user design assigned to the "hard" timing category and the "easy" fitting and power consumption categories, an embodiment of step 305 will determine that timing is the most difficult design goal to satisfy, followed by fitting and power. In an embodiment, categories associated with different design goals will be ranked equally. For an example user design assigned to the "easy" fitting and power consumption categories, an embodiment of step 305 will determine both design goals as equally difficult to satisfy. In an alternative embodiment, categories associated with different design goals are assigned different difficulty levels. For an example user design assigned to the "easy" fitting and power consumption categories, an embodiment of step 305 will determine one of the design goals, for example fitting, as more difficult to satisfy than the other.

Many types of optimization phases determine a set of alternative configurations of a user design and select the configuration that best satisfies design goals. To evaluate the suitability of each configuration, optimization phases typically uses a cost function. Quantitative metrics such as estimated timing values, fitting usage, and power consumption for a configuration of the user design are input to the cost function and the cost function outputs a cost value. Optimization phases can compare the cost values of different configurations of the user design to evaluate the suitability of each configuration. Typically, the configuration with the lowest cost value is considered the "best." Optimization phases can process multiple iterations of sets of alternative configurations to minimize the cost value and find a locally optimal configuration of the user design.

Because optimization phases typically must make trade-offs between competing design goals, cost functions often include a weighted combination of quantitative metrics for each design goal of the user design. The weights associated with each quantitative metric are used to emphasize or deemphasize design goals. For example, a cost function can be expressed as follows:

Cost=($a$*fitting_cost)+($b$*timing_cost)+ ($c$*power_cost)

In the above example, the weights a, b, and c are used to emphasize or deemphasize the optimization of fitting, timing, and power consumption, respectively. For example, increasing the value of b relative to a and c will increase the relative cost of timing in the user design. In an attempt to minimize the value of the cost function, the optimization phase will prefer to select configurations that improve timing (and hence reduce the timing cost) over other configurations that similarly improve fitting or power consumption. However, the optimization phase can still select configurations that improve fitting or power consumption if the cost savings are sufficiently large enough.

Step 310 modifies the cost functions associated with one or more optimization phases to emphasize of the costs of design goals judged in step 305 to be more difficult relative to the other design goals. For an example user design assigned to the "hard" timing category and the "easy" fitting and power consumption categories, an embodiment of step 310 will modify the cost function to emphasize the cost of timing at the expense of fitting and power consumption. As a result, optimization phases using this modified cost function will prefer to select configurations that improve timing (and hence reduce the timing cost) over other configurations that improve fitting or power consumption.

In an embodiment, step 310 changes the weights or other cost function parameters according to the difficulty of each design goal associated with the user design. For example, if the cost function includes weights, such as a, b, and c for the cost function discussed above, step 310 can increase the values of weights associated with more difficult design goals and/or decrease the value of weights associated with less difficult design goals.

Following step 310, step 315 invokes one or more optimization phases on the user design using the modified cost function. As discussed above, the modified cost function focuses the optimization phases on satisfying the more difficult design goals. Less difficult design goals can also be satisfied by the optimization phases. As design goals ranked as difficult typically require more time and computational effort to achieve than easier ranked design goals, optimization phases using a cost function tailored to the relative difficulty of the design goals of the user design will typically achieve better results than optimization phases using a default cost function.

Figure 4:
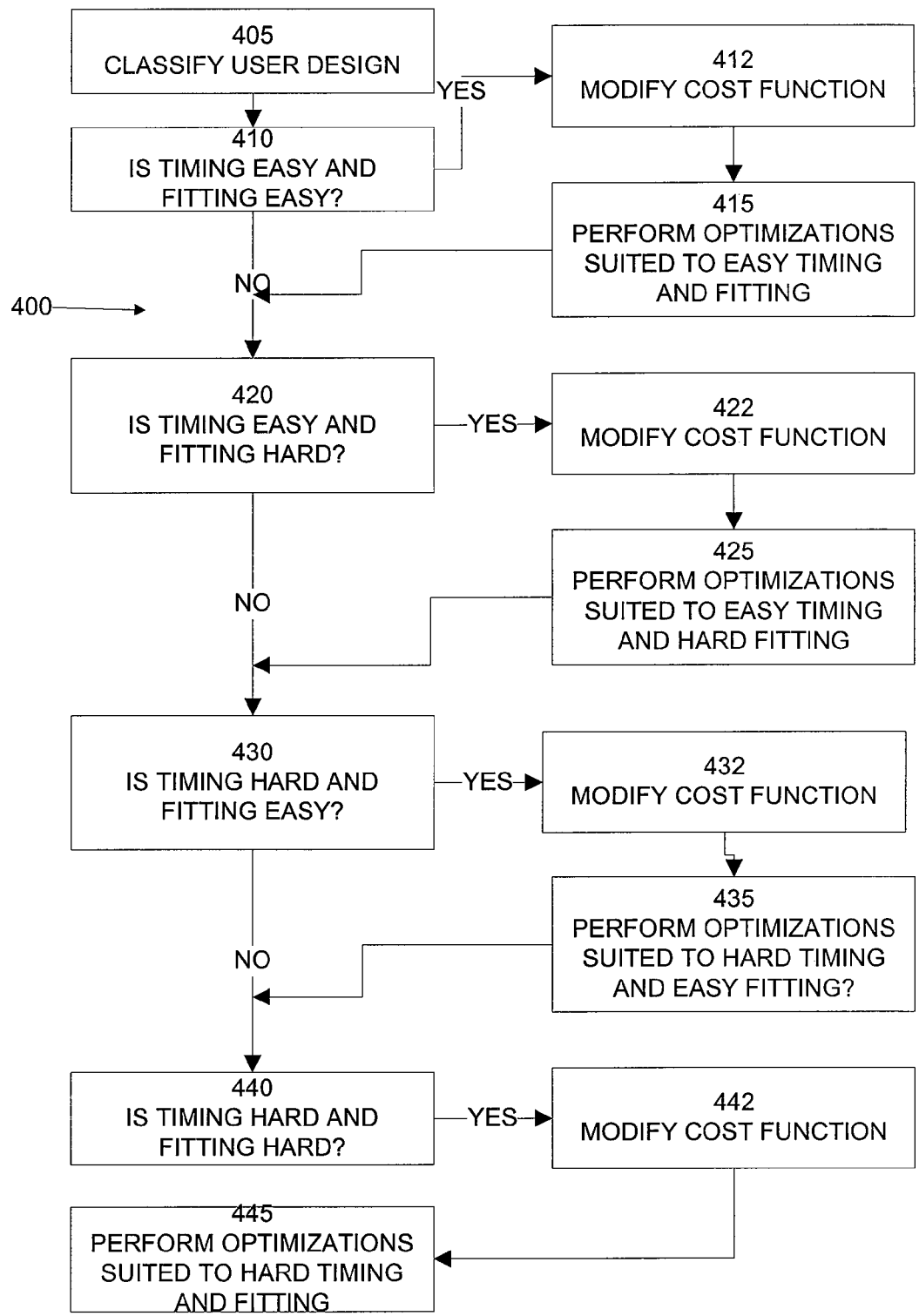
FIG. 4 is a flowchart illustrating a method for tailoring optimization phases to user design according to an embodiment of the invention.

FIG. 4 is a flowchart illustrating an example method 400 for tailoring optimization phases to user designs according to an embodiment of the invention. At step 405, a user design is classified using quantitative metrics associated with each design goal. In an embodiment, the compilation phases estimate the values of quantitative metrics for the user design, such as timing slacks, interconnect usage, fitting congestion, device area usage, and power consumption.

An embodiment of step 405 assigns the user design to an "easy" or "hard" category based on the results of the quantitative metric, for example by comparing each quantitative metric with a threshold value. In further embodiments, additional threshold values can be used to classify user designs into any number of categories for each design goal, rather than only "easy" or "hard" categories.

After the user design has been classified into categories for each of its design goals, step 410 evaluates the classification of the user design. In example method 400, step 410 evaluates whether the user design has been classified in the "easy" timing category and the "easy" fitting category. Other embodiments of example method 400 can evaluate the user design with respect to categories pertaining to other design goals, for example power consumption.

If the user design has been classified in the categories specified in step 410, step 412 modifies one or more cost functions to emphasize the more difficult design goal. In the case of a user design classified in the "easy" timing and fitting categories, step 412 may modify the cost function parameters to apply equal effort to both design goals; for example by using equal weight values. Alternatively, if these categories have different difficulty ranking, step 412 may modify the cost function parameters to emphasize the more difficult design goal.

Following step 412, step 415 optimizes the user design using one or more optimization phases associated with the categories specified by step 410 and using the modified cost function specified by step 412.

Following step 415 or step 410, step 420 evaluates the user design in a similar manner as step 410. In example method 400, step 420 evaluates whether the user design has been classified in the "easy" timing category and the "hard" fitting category. If the user design has been classified in the categories specified in step 420, step 422 determines a modified cost function in a manner similar to step 412. Assuming that the "hard" fitting category has a higher difficulty than the "easy" timing category, step 422 modifies cost function parameters to apply greater optimization effort towards satisfying the fitting design goals. For example, an embodiment of step 422 can increase the weight of a parameter associated with fitting cost, so that optimization phases prefer to select configurations that improve fitting over other design goals. Following step 422, step 425 applies one or more optimization phases to the user design in a manner similar to step 415 using the cost functions specified by step 422.

Following step 425 or step 420, step 430 evaluates the user design in a similar manner as steps 410 and 420. In example method 400, step 430 evaluates whether the user design has been classified in the "hard" timing category and the "easy" fitting category. If the user design has been classified in the categories specified in step 430, step 432 determines a modified cost function that emphasizes the timing design goal in a manner similar to steps 412 and 422. Following step 432, step 435 applies one or more optimization phases to the user design in a manner similar to steps 415 and 425.

Following step 435 or step 430, step 440 evaluates the user design in a similar manner as steps 410, 420, and 430. In example method 400, step 440 evaluates whether the user design has been classified in the "hard" timing category and the "hard" fitting category. If the user design has been classified in the categories specified in step 440, step 442 determines a modified cost function that emphasizes the timing design goal in a manner similar to steps 412, 422, and 432. Following step 442, step 445 applies one or more optimization phases to the user design in a manner similar to steps 415, 425, and 435.

Further embodiments of the method 400 can include additional steps similar to steps 410, 412, and 415 that optimize user designs assigned to any possible combination of categories. Additionally, if each design goal is associated with more than two categories, for example "easy," "medium," and "hard," rather than just "easy" and "hard," method 400 can include additional evaluation, cost function determination, and optimization steps.

In a further embodiment, the categories associated with each design goal may overlap. In this embodiment, a user design can be assigned to two or more categories associated with a given design goal. As a result, the user design can be processed by multiple optimization steps.

In yet another embodiment, the optimization steps, such as steps 415, 425, 435 and 445, can change the classification of the user design based the results of the optimization phases. For example, if a user design is initially classified in the "easy" timing and "easy" fitting categories, step 415 will apply optimization phases tailored to user designs in these categories. However, if the results of the optimization phases in step 415 do not produce satisfactory results, as determined by comparing the metric of the user design with a threshold value, step 415 can reclassify the user design so that an additional optimization step is applied to the user design. In an additional embodiment, optimization steps can be repeated if the results of a previously executed optimization step are unsatisfactory.

Figure 5:
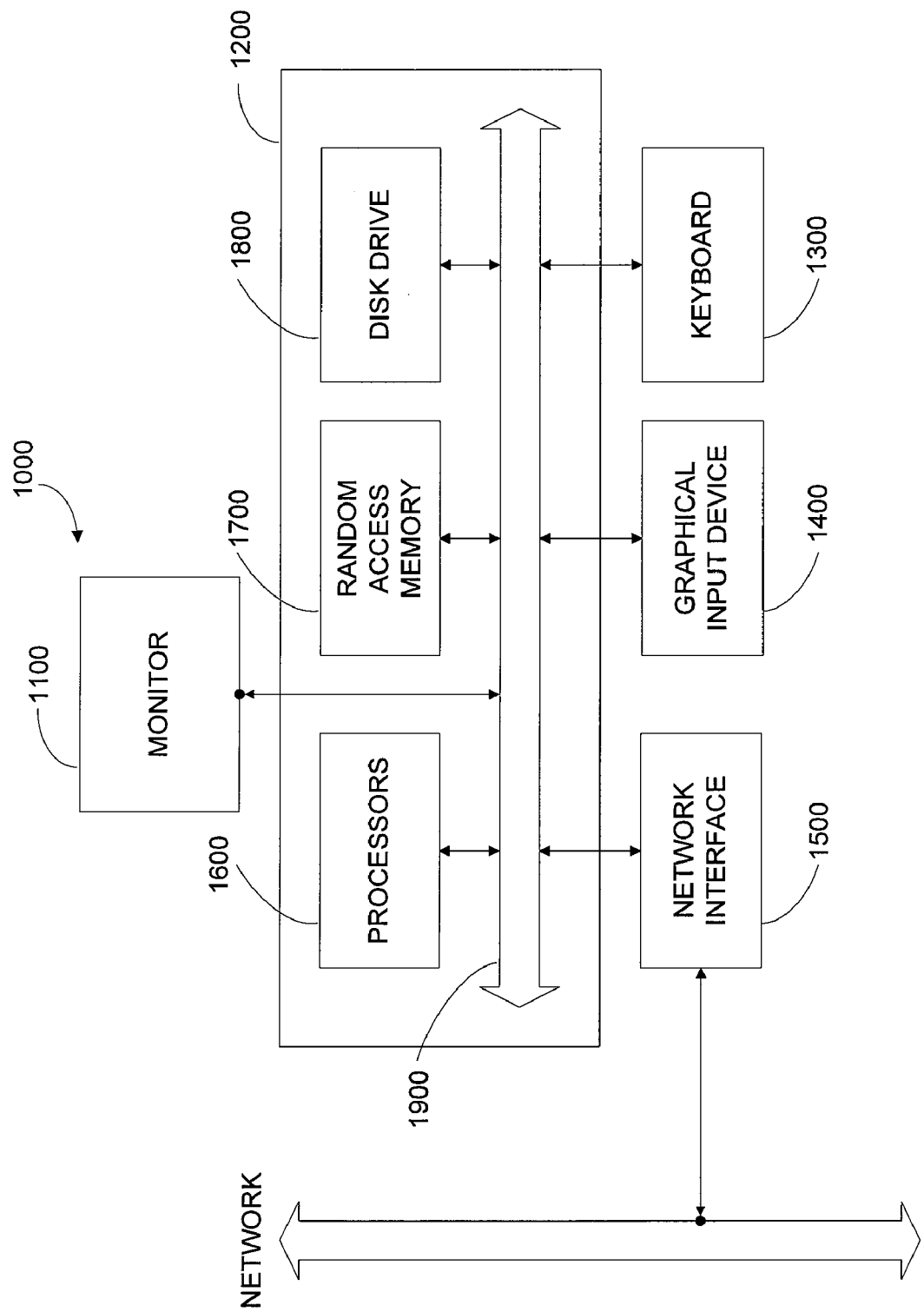
FIG. 5 illustrates an example computer system capable of implementing an embodiment of the invention.

FIG. 5 illustrates an example computer system 1000 capable of implementing an embodiment of the invention. Computer system 1000 typically includes a monitor 1100, computer 1200, a keyboard 1300, a user input device 1400, and a network interface 1500. User input device 1400 includes a computer mouse, a trackball, a track pad, graphics tablet, touch screen, and/or other wired or wireless input devices that allow a user to create or select graphics, objects, icons, and/or text appearing on the monitor 1100. Embodiments of network interface 1500 typically provides wired or wireless communication with an electronic communications network, such as a local area network, a wide area network, for example the Internet, and/or virtual networks, for example a virtual private network (VPN).

Computer 1200 typically includes components such as one or more general purpose processors 1600, and memory storage devices, such as a random access memory (RAM) 1700, disk drives 1800, and system bus 1900 interconnecting the above components. RAM 1700 and disk drive 1800 are examples of tangible media for storage of data, audio/video files, computer programs, applet interpreters or compilers, virtual machines, and embodiments of the herein described invention. Further embodiments of computer 1200 can include specialized input, output, and communications subsystems for configuring, operating, testing, and communicating with programmable devices. Other types of tangible media include floppy disks; removable hard disks; optical storage media such as DVD-ROM, CD-ROM, and bar codes; non-volatile memory devices such as flash memories; read-only-memories (ROMS); battery-backed volatile memories; and networked storage devices.

Further embodiments can be envisioned to one of ordinary skill in the art after reading the attached documents. For example, although the invention has been discussed with reference to programmable devices, it is equally applicable to logic minimization applications used to design any type of digital device, such as standard or structured ASICs, gate arrays, and general digital logic devices. In other embodiments, combinations or sub-combinations of the above disclosed invention can be advantageously made. The block diagrams of the architecture and flow charts are grouped for ease of understanding. However it should be understood that combinations of blocks, additions of new blocks, re-arrangement of blocks, and the like are contemplated in alternative embodiments of the present invention.

The specification and drawings are, accordingly, to be regarded in an illustrative rather than a restrictive sense. It will, however, be evident that various modifications and changes may be made thereunto without departing from the broader spirit and scope of the invention as set forth in the claims.

What is claimed is:

1. A method of determining the configuration of a programmable device, the method comprising:
   classifying the user design into at least one category associated with each of a plurality design goals, thereby forming a set of categories associated with the user design, wherein for each design goal, classifying the user design further comprises:
   determining a value for a quantitative metric associated with the design goal, the quantitative metric being used to classify the user design into a category;

comparing the value of the quantitative metric to a threshold value associated with the design goal; and assigning a category to the design goal based upon results of the comparison; and selecting an optimization phase associated with each of the at least one category, wherein the optimization phase is adapted to optimize user designs classified in the category; and determining a set of parameters for the selected optimization phase according to the category to specify the behavior of the selected optimization phase.

2. The method of claim 1, wherein the category represents the difficulty of satisfying the first design goal.

3. The method of claim 1, wherein the design goal is a timing goal.

4. The method of claim 1, wherein the design goal is a fitting goal.

5. The method of claim 1, wherein the design goal is a power consumption goal.

6. The method of claim 1, further comprising:

applying the optimization phase to the user design;

re-classifying the user design into an additional category if the user design does not satisfy the first design goal; and selecting an additional optimization phase associated with the additional category, wherein the additional optimization phase is adapted to optimize user designs classified in the additional category.

7. The method of claim 1, wherein the user design is associated with design goals, and wherein:

classifying further comprises classifying the user design into at least one category for each of the design goals, thereby forming a set of categories associated with the user design; and selecting further comprises selecting an optimization phase associated with the set of categories associated with the user design, wherein the optimization phase is adapted to optimize user designs associated with the set of categories.

8. The method of claim 7, further comprising:

determining a ranking of the relative difficulties of the design goals based on the set of categories associated with the user design; and determining the set of parameters of the selected optimization phase to emphasize at least one of the design goals according to the ranking.

9. The method of claim 8, wherein the set of parameters are a set of weights for a cost function used by the optimization phase to evaluate the suitability of a set of alternative configurations of the user design.

10. A method of determining the configuration of a programmable device, the method comprising:

classifying the user design associated with design goals into at least one category for each of the design goals, thereby forming a set of categories associated with the user design, classifying the user design further comprising for each design goal:

determining a value for a quantitative metric associated with the design goal, the quantitative metric being used to classify the user design into a category;

comparing the value of the quantitative metric to a threshold value associated with the design goal; and assigning a category to the design goal based upon results of the comparison;

determining a ranking of the relative difficulties of the design goals based on the set of categories associated with the user design; and determining a set of parameters of an optimization phase to emphasize at least one of the design goals according to the ranking.

11. The method of claim 10, wherein the set of parameters are a set of weights for a cost function used by the optimization phase to evaluate the suitability of a set of alternative configurations of the user design.

12. The method of claim 10, wherein the design goals includes a timing goal.

13. The method of claim 10, wherein the design goals includes a fitting goal.

14. The method of claim 10, wherein the design goals includes a power goal.

15. An information storage medium including a plurality of instructions adapted to direct an information processing device to determine the configuration of a programmable logic device, comprising instructions for:

classifying the user design into at least one category associated with each of a plurality design goals, thereby forming a set of categories associated with the user design, wherein each category represents the difficulty of satisfying a design goal, and wherein for each design goal, classifying the user design further comprises:

determining a value for a quantitative metric associated with the design goal, the quantitative metric being used to classify the user design into a category;

comparing the value of the quantitative metric to a threshold value associated with the design goal; and assigning a category to the design goal based upon results of the comparison;

selecting an optimization phase associated with each of the at least one category, wherein the optimization phase is adapted to optimize user designs classified in the category; and determining a set of parameters for the selected optimization phase according to each category to specify the behavior of the selected optimization phase.

16. The information storage medium of claim 15, wherein the category represents the difficulty of satisfying the first design goal.

17. The information storage medium of claim 15, wherein the design goal is a timing goal.

18. The information storage medium of claim 15, wherein the design goal is a fitting goal.

19. The information storage medium of claim 15, wherein the design goal is a power consumption goal.

20. The information storage medium of claim 15, further comprising:

applying the optimization phase to the user design;

re-classifying the user design into an additional category if the user design does not satisfy the first design goal; and selecting an additional optimization phase associated with the additional category, wherein the additional optimization phase is adapted to optimize user designs classified in the additional category.

21. The information storage medium of claim 15, wherein the user design is associated with a set of design goals, and wherein:

classifying further comprises classifying the user design into at least one category for each of the design goals, thereby forming a set of categories associated with the user design; and selecting further comprises selecting an optimization phase associated with the set of categories associated with the user design, wherein the optimization phase is adapted to optimize user designs associated with the set of categories.

22. The information storage medium of claim 21, further comprising:
   determining a ranking of the relative difficulties of the design goals based on the set of categories associated with the user design; and
   determining the set of parameters of the selected optimization phase to emphasize at least one of the design goals according to the ranking.

23. The information storage medium of claim 22, wherein the set of parameters are a set of weights for a cost function used by the optimization phase to evaluate the suitability of a set of alternative configurations of the user design.

24. An information storage medium including a plurality of instructions adapted to direct an information processing device to determine the configuration of a programmable logic device, comprising instructions for:
   classifying the user design associated with design goals into at least one category for each of the design goals, thereby forming a set of categories associated with the user design, wherein for each design goal, classifying the user design further comprises:
      determining a value for a quantitative metric associated with the design goal, the quantitative metric being used to classify the user design into a category;
      comparing the value of the quantitative metric to a threshold value associated with the design goal; and
      assigning a category to the design goal based upon results of the comparison;
   determining a ranking of the relative difficulties of the design goals based on the set of categories associated with the user design; and
   determining a set of parameters of an optimization phase to emphasize at least one of the design goals according to the ranking.

25. The information storage medium of claim 24, wherein the set of parameters are a set of weights for a cost function used by the optimization phase to evaluate the suitability of a set of alternative configurations of the user design.

26. The information storage medium of claim 24, wherein the design goals includes a timing goal.

27. The information storage medium of claim 24, wherein the design goals includes a fitting goal.

28. The information storage medium of claim 24, wherein the design goals includes a power goal.

* * * * *

UNITED STATES PATENT AND TRADEMARK OFFICE
CERTIFICATE OF CORRECTION

PATENT NO. : 7,415,682 B2
APPLICATION NO. : 11/097592
DATED : August 19, 2008
INVENTOR(S) : Padalia et al.

Page 1 of 1

It is certified that error appears in the above-identified patent and that said Letters Patent is hereby corrected as shown below:

Claim 1 at col. 8, line 61, insert --of-- after "plurality"

Signed and Sealed this

Fourteenth Day of October, 2008

JON W. DUDAS
*Director of the United States Patent and Trademark Office*